(12) United States Patent
Intrieri et al.

(10) Patent No.: US 9,070,808 B2
(45) Date of Patent: *Jun. 30, 2015

(54) SUPPLEMENTAL SOLAR ENERGY COLLECTOR

(71) Applicant: Sun Drum Solar, LLC, Northborough, MA (US)

(72) Inventors: Michael Intrieri, Northborough, MA (US); Ronald J. Smith, Granite Bay, CA (US)

(73) Assignee: Sun Drum Solar, LLC, Northborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/481,062

(22) Filed: Sep. 9, 2014

(65) Prior Publication Data

US 2014/0373902 A1 Dec. 25, 2014

Related U.S. Application Data

(63) Continuation of application No. 12/290,957, filed on Nov. 5, 2008, now Pat. No. 8,835,745, which is a continuation-in-part of application No. 12/150,888, filed on Apr. 30, 2008, now abandoned.

(60) Provisional application No. 61/002,515, filed on Nov. 9, 2007, provisional application No. 60/933,477, filed on Jun. 5, 2007.

(51) Int. Cl.
*H01L 31/062* (2012.01)
*H01L 31/052* (2014.01)
(Continued)

(52) U.S. Cl.
CPC ....... *H01L 31/0521* (2013.01); *Y10T 29/49117* (2013.01); *F24J 2/20* (2013.01);
(Continued)

(58) Field of Classification Search
CPC ..... H01L 31/00; H01L 31/024; H01L 31/042; H01L 31/048; H01L 31/0482; H01L 31/0483; H01L 31/05; H01L 31/052; H01L 31/0521; H01L 31/058; F24J 2/00; F24J 2/0007; F24J 2/04; F24J 2/0483; F24J 2/0488; F24J 2/20; F24J 2/202; F24J 2/201; F24J 2002/0092; F24J 2002/0038; F24J 2002/0046

See application file for complete search history.

(56) References Cited

U.S. PATENT DOCUMENTS 4,002,031 A 1/1977 Bell
4,080,221 A 3/1978 Manelas
(Continued)

FOREIGN PATENT DOCUMENTS

JP 10-062017 3/1998

OTHER PUBLICATIONS

International Searching Authority, Written Opinion for Int'l. Application No. PCT/US2008/012615, Jan. 16, 2009, 5 pages (unnumbered).

(Continued)

*Primary Examiner* — Christina Chern
(74) *Attorney, Agent, or Firm* — Iandiorio Teska & Coleman, LLP

(57) ABSTRACT

A supplemental solar energy collection system including a photovoltaic panel which converts incident radiation into electricity. A housing includes a top thermally conductive surface mated with the photovoltaic panel and serving as a thermal collector. Open channels behind the thermally conductive surface carry fluid in contact with the top thermally conductive surface for removing heat from the photovoltaic panel.

3 Claims, 21 Drawing Sheets

(51) Int. Cl.
*H02S 40/44* (2014.01)
*H01L 31/18* (2006.01)
*H01L 31/042* (2014.01)
*F24J 2/20* (2006.01)
*F24J 2/46* (2006.01)

(52) U.S. Cl.
CPC ........ *F24J 2/4647* (2013.01); *F24J 2002/4603* (2013.01); *Y02E 10/52* (2013.01); *Y02E 10/60* (2013.01); *H02S 40/44* (2013.01); *H01L 31/18* (2013.01); *H02S 40/00* (2013.01)

(56) References Cited

U.S. PATENT DOCUMENTS

| | | | |
|---|---|---|---|
| 4,095,997 A | 6/1978 | Griffiths | |
| 4,245,619 A | 1/1981 | Ogilvie | |
| 4,287,883 A | 9/1981 | Kyrias | |
| 4,345,587 A * | 8/1982 | Carvalho | 126/662 |
| 4,392,008 A | 7/1983 | Cullis et al. | |
| 4,437,456 A * | 3/1984 | Merrigan | 126/637 |
| 5,851,309 A | 12/1998 | Kousa | |
| 6,029,656 A | 2/2000 | Schwarz | |
| 6,080,927 A | 6/2000 | Johnson | |
| 6,360,497 B1 | 3/2002 | Nakazima et al. | |
| 6,402,897 B1 | 6/2002 | Gunn | |
| 6,630,622 B2 | 10/2003 | Konold | |
| 6,689,949 B2 | 2/2004 | Ortabasi | |
| 6,730,640 B2 | 5/2004 | Sasaoke et al. | |
| 7,076,965 B2 | 7/2006 | Lasich | |
| 2004/0011395 A1 | 1/2004 | Nicoletti et al. | |
| 2004/0025931 A1 | 2/2004 | Aguglia | |
| 2007/0079865 A1 | 4/2007 | Warfield et al. | |
| 2007/0089375 A1 | 4/2007 | Helner et al. | |
| 2007/0186922 A1 | 8/2007 | Guenter | |
| 2009/0065046 A1 | 3/2009 | DeNault | |

OTHER PUBLICATIONS

International Searching Authority, Written Opinion for Int'l. Application No. PCTJUS2008/006930, Aug. 29, 2008, 3 pages (unnumbered).
3M, "3M VHB™ Tapes", Technical Data Sheet, Nov. 2005, 1 page.

* cited by examiner

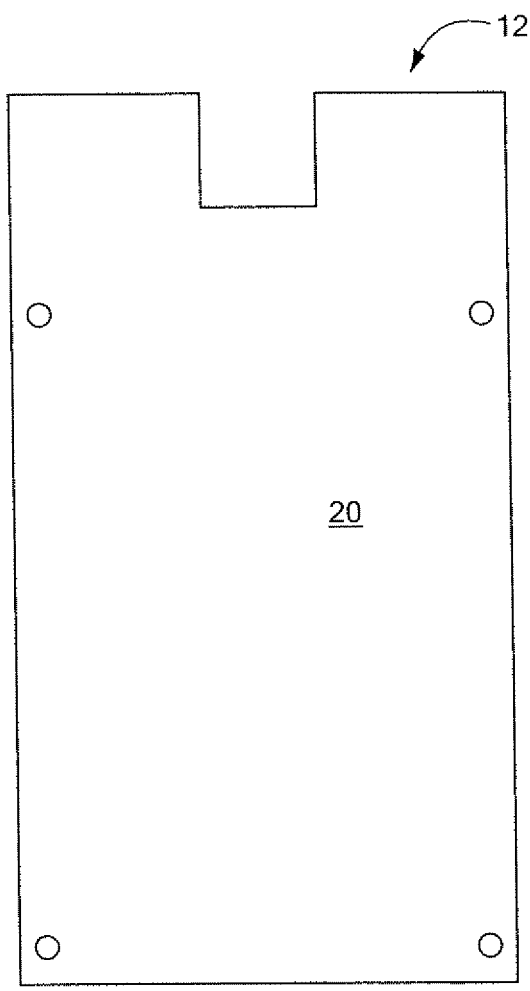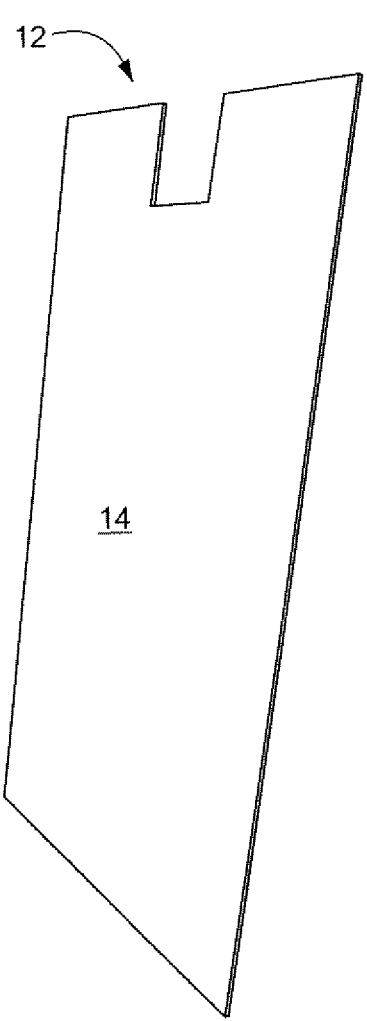
*FIG. 2*   *FIG. 3*

(SSEC Enabled Hydrogen Separation System)

SUPPLEMENTAL SOLAR ENERGY COLLECTOR

RELATED APPLICATIONS

This application is a continuation application of U.S. patent application Ser. No. 12/290,957, filed on Nov. 5, 2008, which hereby claims the benefit of and priority thereto under 35 U.S.C. §§119, 120, 363, 365, and 37 C.F.R. §§1.55 and 1.78, which is incorporated herein by reference and which is a continuation-in-part application of U.S. patent application Ser. No. 12/150,888, filed Apr. 30, 2008, and which also claims the benefit of and priority to U.S. Provisional Application No. 61/002,515, filed Nov. 9, 2007, and U.S. patent application Ser. No. 12/150,888 claims the benefit of U.S. Provisional Application No. 60/933,477, filed Jun. 5, 2007, filed under 35 U.S.C. §§119, 120, 363, 365, and 37 C.F.R. §1.55 and §1.78, all of which are incorporated herein by reference.

FIELD OF THE INVENTION

This subject invention relates to solar panels.

BACKGROUND OF THE INVENTION

Solar panels serve to either heat a fluid or to convert solar radiation into electricity (e.g., photovoltaic panels). U.S. Pat. No. 6,080,927, incorporated herein by this reference, discloses a solar concentrator which both generates electricity and heats water flowing in pipes adjacent a solar cell array.

The known prior art regarding such hybrid systems, however, involves rather complex specialized designs which cannot be used in conjunction with commercially available photovoltaic panels. The prior art also fails to maximize the surface area of the heat transfer fluid contacting the photovoltaic panel. Moreover, the prior art typically involves complex and expensive designs.

Early hybrid systems focused on the individual photovoltaic cell. U.S. Pat. No. 4,002,031, incorporated herein by this reference, discloses a design which seeks to maximize the efficiency of the photovoltaic cell. U.S. Pat. No. 4,080,221, also incorporated herein by this reference, discloses a hybrid collector that allows electric energy in addition to thermal energy to be collected by air and liquid. The design is complex and difficult to manufacture. U.S. Pat. Nos. 6,029,656; 6,080,927; 4,095,997; 4,392,008; and 6,630,622, all incorporated herein by this reference, also disclose some form of a hybrid system.

BRIEF SUMMARY OF THE INVENTION

It is therefore an object of this invention to provide a supplemental solar energy collection system which can be used in connection with commercially available photovoltaic panels.

It is a further object of this invention to provide such a system which is designed to maximize the surface area of the heat transfer fluid contacting the photovoltaic panel.

It is a further object of this invention to provide such a system which does not involve complex or expensive designs.

It is a further object of this invention to provide such a system which cools the photovoltaic panel to improve electrical efficiency.

It is a further object of this invention to provide such a system which maximizes efficiency and versatility while minimizing costs.

The subject invention results from the realization that a hermetically sealed housing can be inexpensively made out of a high thermally conductive material to mate with the rear of a photovoltaic panel to act as a thermal collector, heat exchanger, and conduit for liquid transport.

The subject invention, however, in other embodiments, need not achieve all these objectives and the claims hereof should not be limited to structures or methods capable of achieving these objectives.

This subject invention features a supplemental solar energy collection system comprising a photovoltaic panel for converting incident radiation into electricity and a housing with a top thermally conductive surface mated with the photovoltaic panel and serving as a thermal collector. Open channels behind the thermally conductive surface carry fluid in contact with the top thermally conductive surface for removing heat from the photovoltaic panel.

The preferred top thermally conductive surface is made of aluminum or another thermally conductive material. Thermal grease or thermal pads may be used between the top thermally conductive surface and the photovoltaic panel to both conduct heat and protect the two surfaces. Typically there is an inlet into the housing and at least one outlet out of the housing for fluid in the channels. In one embodiment, the housing includes a bottom surface and first and second side walls and first and second end walls connecting the bottom surface to the top surface. The channels may be defined by gaskets between the bottom surface and the top surface.

In one example, alternating plates extend from the first end wall to a location spaced from the second end wall and then from the second end wall to a location spaced from the second end wall and then from the second end wall to a location spaced from the first end wall. In another example, alternating plates extend from the first side wall to a location spaced from the second side wall and then from the second side wall to a location spaced from the first side wall. If the photovoltaic panel includes a frame, the housing may reside within the frame, the frame is used to mate the panel of the frame via brackets. Insulation covers the housing within the frame.

The subject invention features a supplemental solar energy collection system comprising a photovoltaic panel for converting incident radiation into electricity. A housing includes a top thermally conductive surface mated with the photovoltaic panel and serving as a thermal collector, a bottom, and a gasket between the top and bottom defining channels between the top thermally conductive surface and the bottom for fluid in contact with the top thermally conductive surface for removing heat from the photovoltaic panel.

Preferably, the top thermally conductive surface is made of aluminum or another thermally conductive material. In one example, the photovoltaic panel may include a frame, the housing may reside within the frame, and insulation may fill the frame over the housing. Typically, fasteners may connect the top and bottom and compress the gasket. The gasket channels may be configured in a waterfall or snake pattern. The gasket can include an adhesive material and/or epoxy. Thermal grease and/or thermal pads may be located between the top thermally conductive surface and the photovoltaic panel. One gasket includes a periphery and dividers within the periphery defining the fluid channels. Select dividers are spaced from the periphery by a small gap.

The subject invention also features a method of manufacturing a supplemental solar energy collection system. The method typically includes assembling one panel of a housing, applying adhesive sections onto the panel to define fluid channels, assembling a second panel onto the adhesive sections to complete the housing, and coupling the housing to a photovoltaic panel configured to convert incident radiation into electricity so heat is removed from the photovoltaic panel by fluid flowing in the fluid channels. The gasket may be made of an adhesive material and/or an epoxy material. The method further may include applying thermal grease and/or thermal pads between the top thermally conductive surface and the photovoltaic panel. The method also includes a gasket which includes a periphery and dividers within the periphery which define the fluid channels. The dividers may be spaced from the periphery by a small gap.

One featured method of manufacturing a supplemental solar energy collection system includes assembling top and bottom panels of a housing, configuring a gasket to define fluid channels, placing the gasket between the top and bottom panels to complete the housing, and coupling the housing top panel to a photovoltaic panel configured to convert incident radiation into electricity so heat is removed from the photovoltaic panel by fluid flowing in the gasket fluid channels.

The subject invention also features an integrated supplemental solar energy collection system. A photovoltaic panel converts incident radiation into electricity. A housing includes a bottom mated to the photovoltaic panel and a gasket between the bottom and the photovoltaic panel which defines channels between the photovoltaic panel and the bottom for fluid in contact with the photovoltaic panel for removing heat from the photovoltaic panel.

The subject invention also features a method of manufacturing an integrated supplemental solar energy collection system. The fluid channels are formed on a panel. A photovoltaic panel is assembled onto the panel to convert incident radiation into electricity so heat is removed from the photovoltaic panel by fluid flowing in the fluid channels. Fluid channels may be formed on either the top or bottom panel.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 2 is a schematic bottom view of the housing portion of the system shown in FIG. 1;

FIG. 3 is a schematic view showing the top and side portions of the housing shown in FIG. 2;

DETAILED DESCRIPTION OF THE INVENTION

Figure 1:
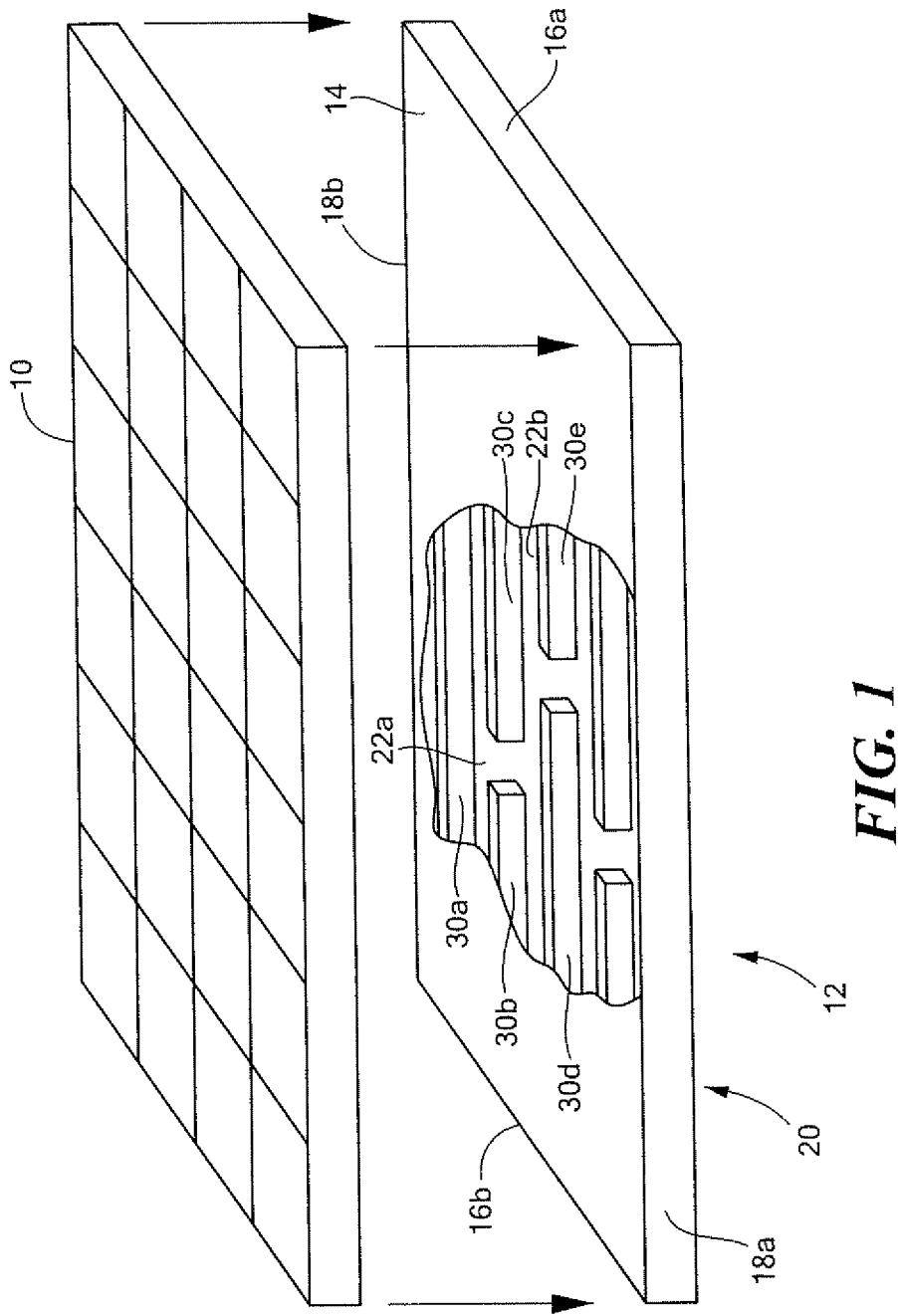
FIG. 1 is a highly schematic exploded view showing the primary components associated with an example of a supplemental solar energy collection system in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

FIG. 1 shows photovoltaic panel 10 which converts incident solar radiation to electricity. Photovoltaic panel 10 is typically commercially available. FIG. 1 also shows supplemental solar energy collection housing 12 in accordance with the subject invention. Housing 12 includes top thermally conductive surface 14 (typically made of a thin sheet of aluminum) mated with the underside of photovoltaic panel 10 thus serving as a thermal collector.

In this preferred embodiment, housing 12 end walls 16a and 16b, side walls 18a and 18b, and bottom surface wall 20 define a hermetically sealed cavity with channels 22a, 22b, and the like therein carrying fluid in direct contact with the underside of top thermally conductive surface 14 itself mated with the underside of photovoltaic panel 10. In this example, these channels are defined by plates extending from the bottom surface 20 of housing 12 to the top surface 14 forming a gasket between the top and bottom of the housing. As shown, plates 30a, 30b, and 30c define channel 22a, while plates 30b, 30c, 30d, and 30e define channel 22b. Typically, insulation covers bottom surface 20 and may extend up around side walls 18a and 18b and end walls 16a and 16b.

Figure 4:
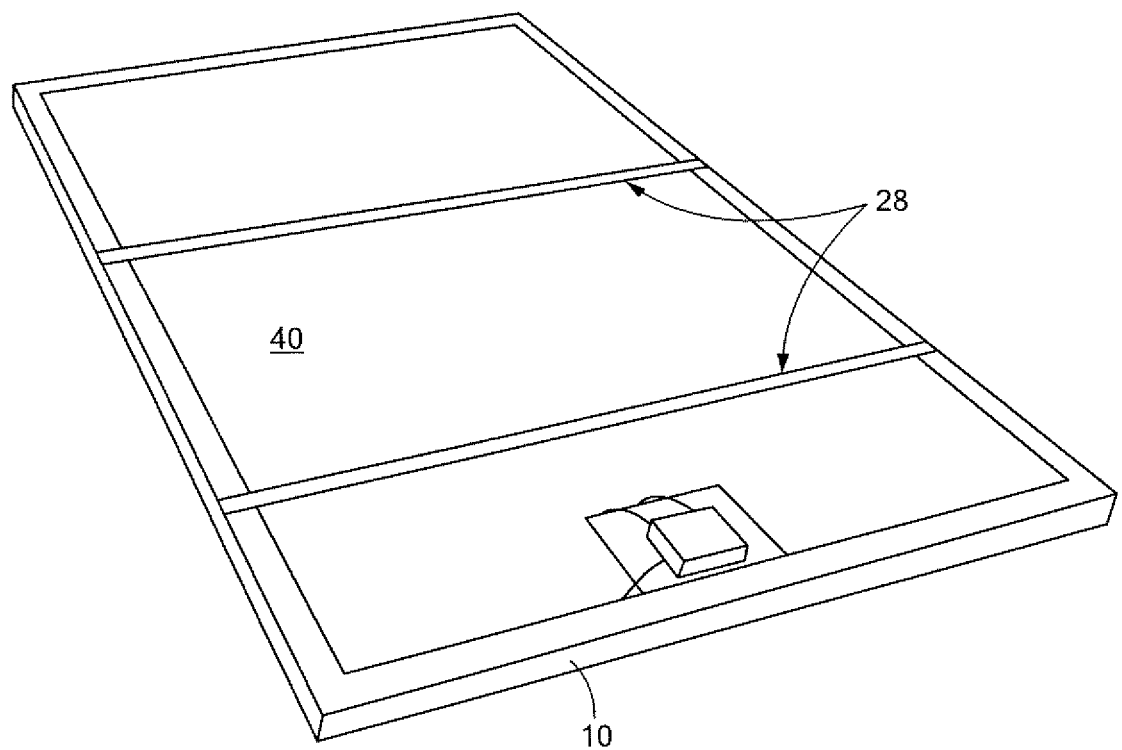
FIG. 4 is a schematic three-dimensional rear view showing the housing of FIGS. 2 and 3 assembled onto a photovoltaic panel.
Figure 5:
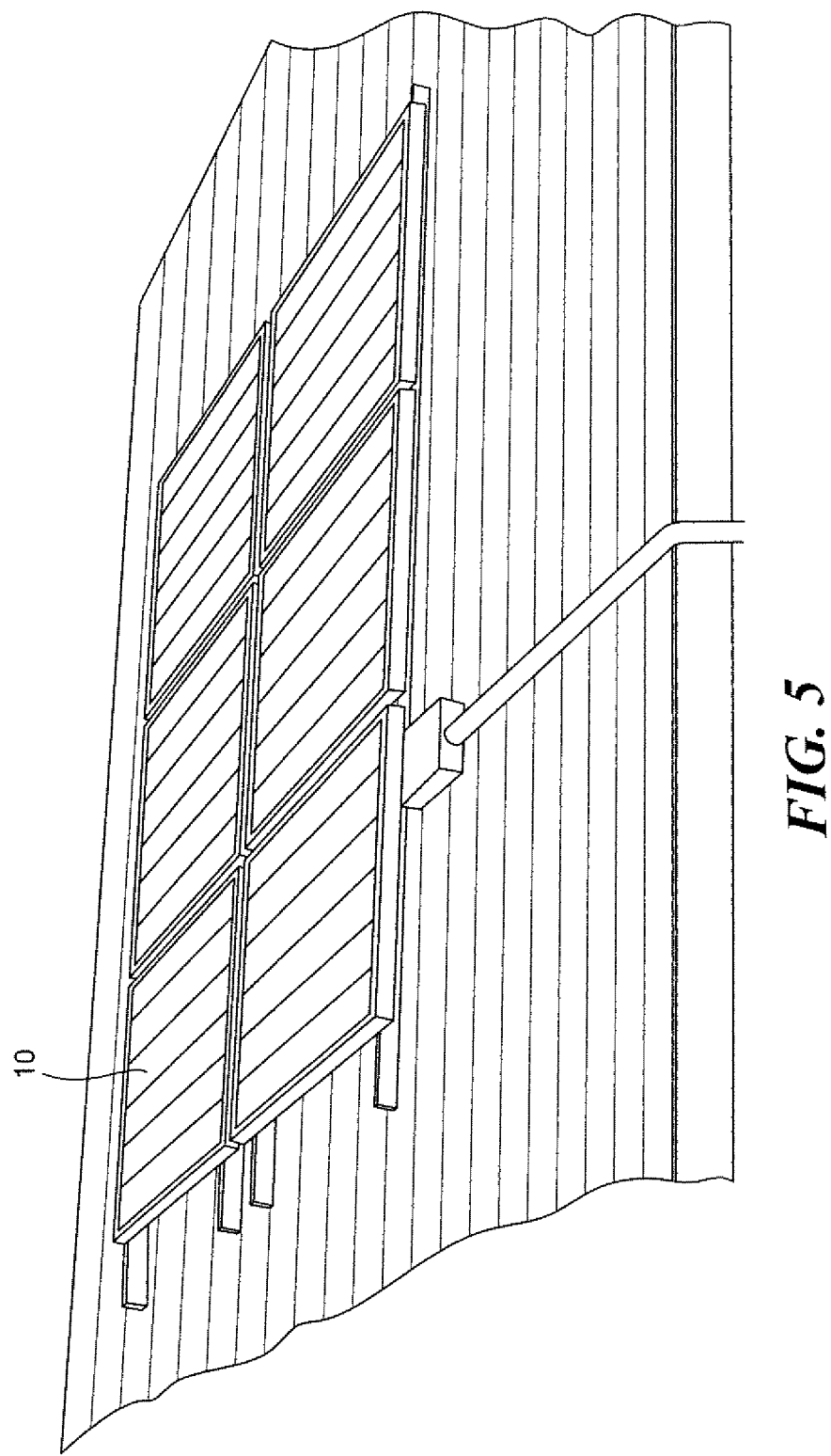
FIG. 5 is a schematic three-dimensional top view showing a complete system in accordance with the subject invention installed on the roof of a dwelling.

FIG. 2 also shows the bottom surface 20 of the hermetically sealed thermal collection housing while FIG. 3 shows top surface 14. FIG. 4 shows brackets 28 securing a housing onto photovoltaic panel 10 within its frame and the addition of insulation 40. FIG. 5 shows an example of photovoltaic panels mated with several thermal collection housings in accordance with the subject invention installed on the roof of a dwelling.

Figure 6:
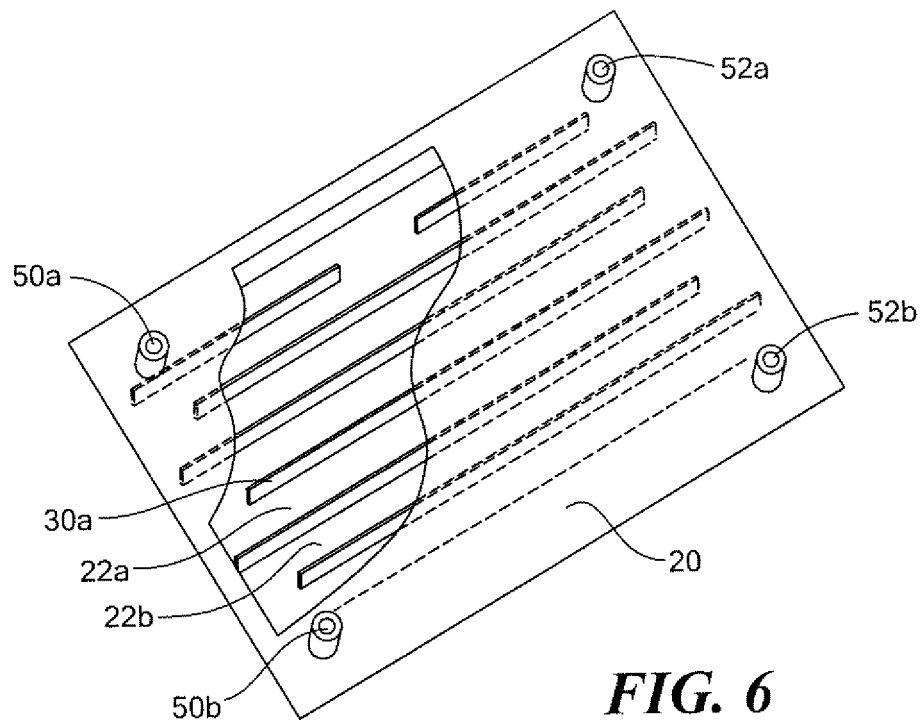
FIG. 6 is a schematic partially cut away view showing the bottom portion of the supplemental energy collector housing in accordance with the subject invention.
Figure 7:
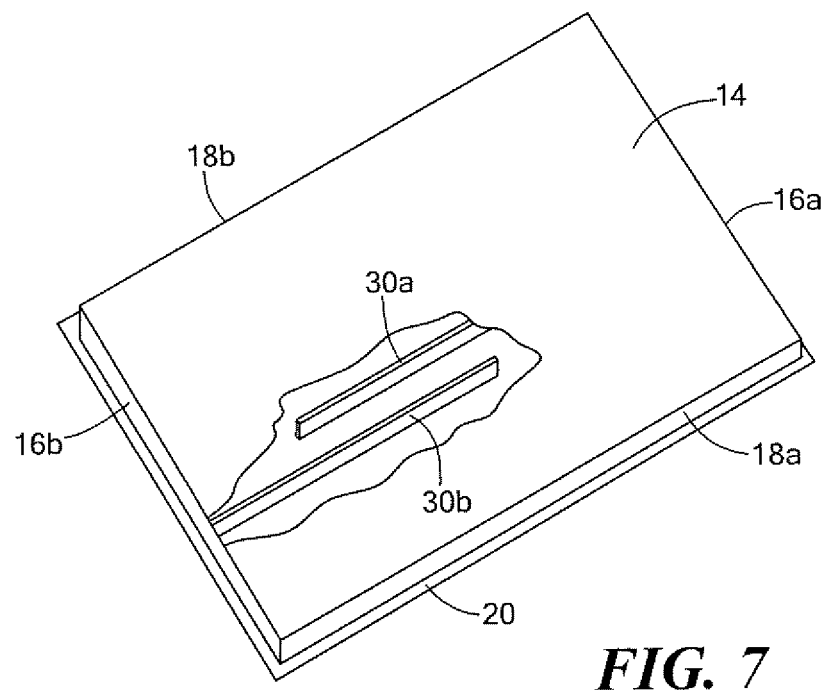
FIG. 7 is a schematic three-dimensional top view showing an example of a hermetically sealed housing in accordance with the subject invention.

FIG. 6 shows bottom surface 20 with inlets 50a and 50b and outlets 52a and 52b for the fluid flowing within channels 22a, 22b, and the like defined by divider 30a and the like. As shown in FIG. 7, divider or gasket 30a extends from end wall 16a to the position spaced from end wall 16b while alternating divider 30b extends from end wall 16b to a position spaced from end wall 16a. The dividers can also similarly alternate between extending from side wall 18a to a position spaced from side wall 18b and plates extending from side wall 18b to a position spaced from side wall 18a. Thermal grease can be spread across top thermally conductive surface 14 to provide a good thermal connection between top surface 14 and the bottom surface of the photovoltaic panel. Thermal pads, e.g., Dow TP-1560 pads, can also be used.

Figure 8:
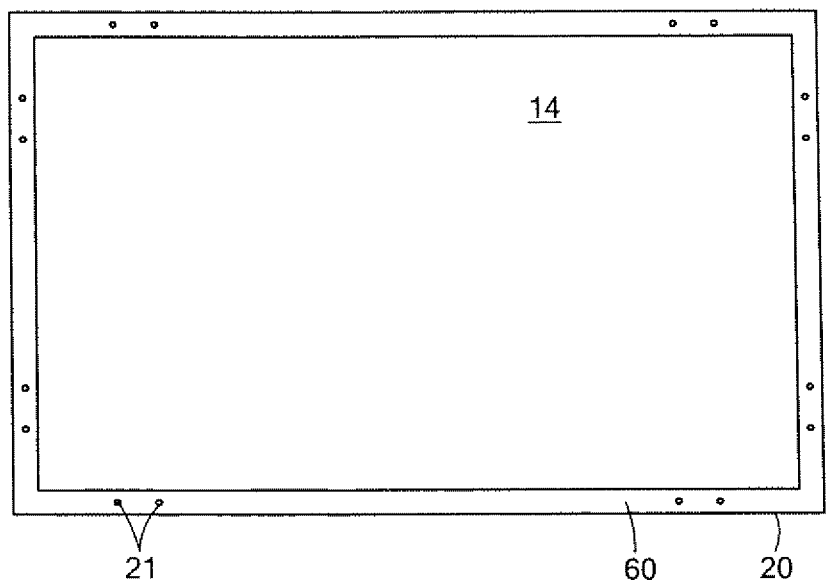
FIG. 8 is another schematic top view of a hermetically sealed housing in accordance with the subject invention.
Figure 9:
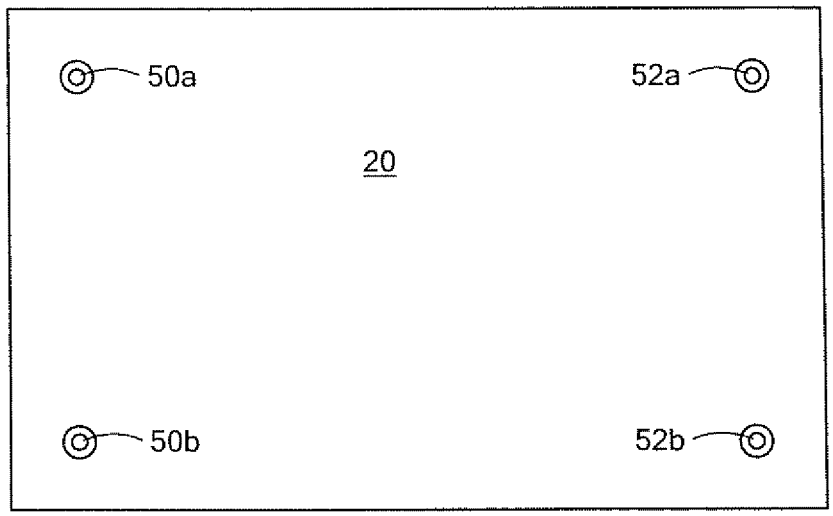
FIG. 9 is another schematic view of the bottom of a hermetically sealed housing in accordance with the subject invention.
Figure 10:
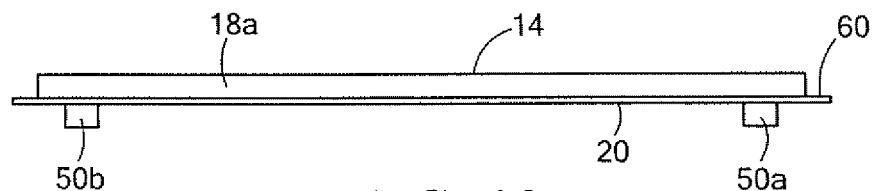
FIG. 10 is a schematic view showing the front side wall of a hermetically sealed housing in accordance with the subject invention.
Figure 11:
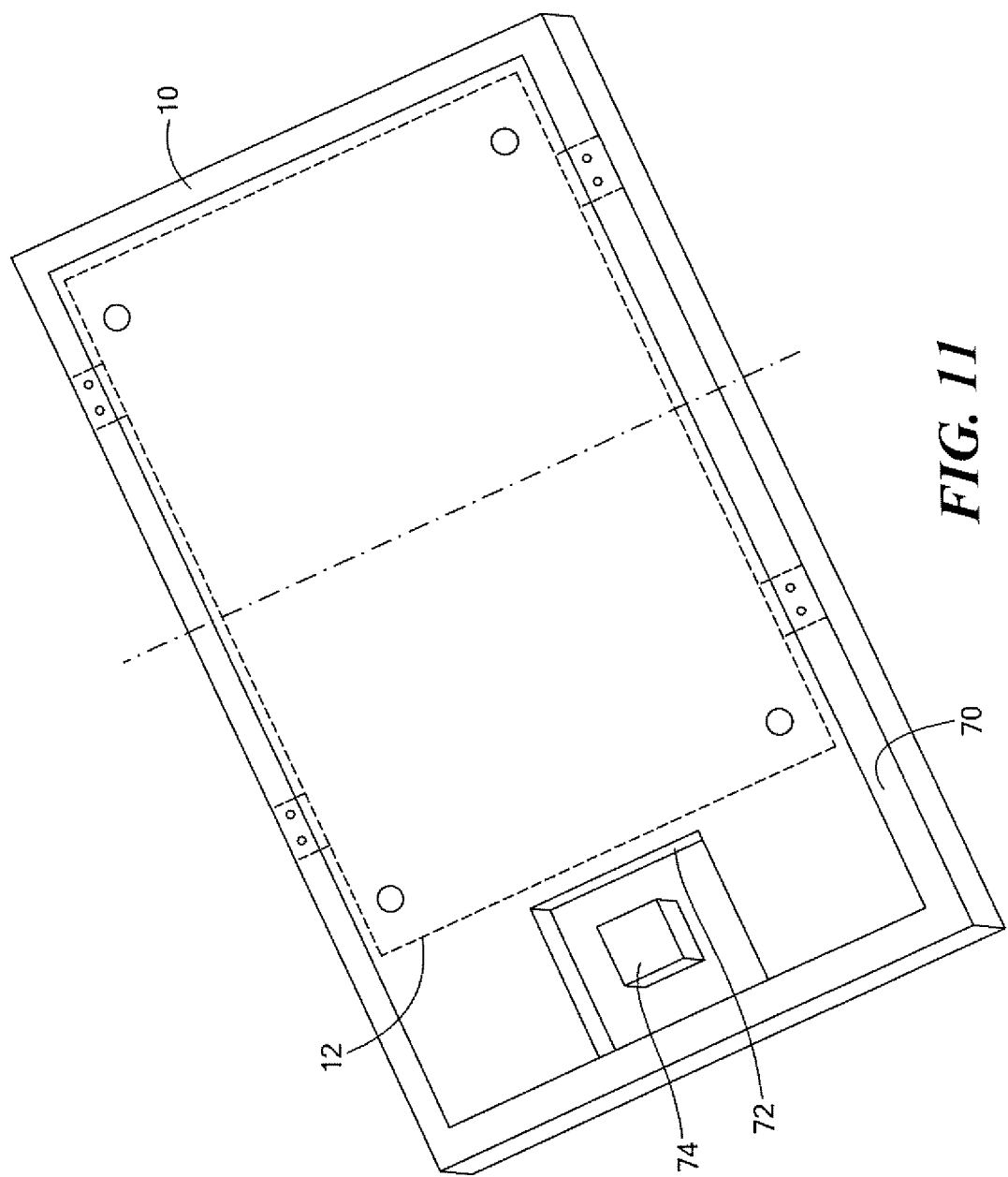
FIG. 11 is a schematic three-dimensional view showing a hermetically housing mated to a photovoltaic panel and then sealed with insulation in accordance with the subject invention.

FIG. 8 shows top surface 14 and how bottom surface 20 may include peripheral flange portion 60 so that the bottom surface can be fastened too other structures without impacting the hermetic seal of the housing. FIG. 9 also shows bottom surface 20 and flow inlets 50a and 50b and outlets 52a and 52b. FIG. 10 shows side wall 18a. FIG. 11 shows a hermetically sealed collector housing in accordance with the subject invention mated with a photovoltaic panel including frame 70. The housing is shown in relief at 12 and it is covered with insulation 72 except in the area of the electrical junction box 74 of the photovoltaic panel.

Figure 13:
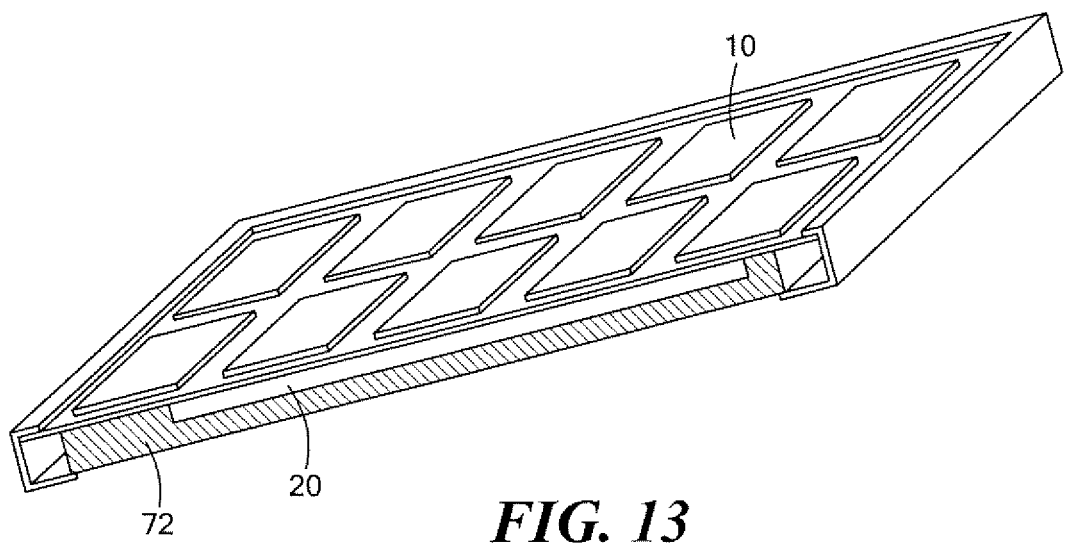
FIG. 13 is a schematic three-dimensional cross-sectional view of the assembly shown in FIG. 11.
Figure 12:
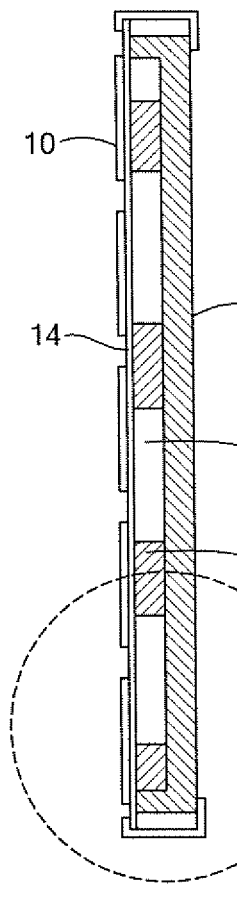
FIG. 12 is a side view of the assembly shown in FIG. 11.
Figure 14:
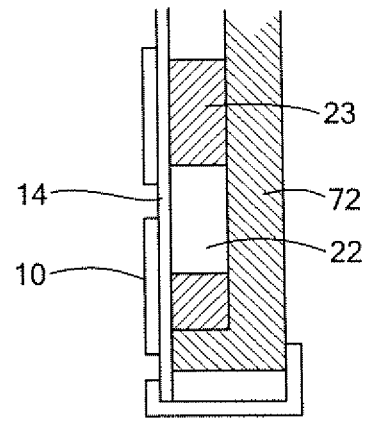
FIG. 14 is a partial schematic cross-sectional view showing a portion of the assembly of FIG. 11.

FIG. 12 shows a horizontal cross-section of SSEC 12 mated to photovoltaic panel 10. FIG. 13 shows a vertical cross-section of the SSEC mated to a photovoltaic panel. FIG. 14 shown in more detail the interface of the SSEC and PV panel showing they are touching but not attached at the panel interface 14. In one preferred example, gap 14 is designed to be 0.040 inches. FIG. 14 demonstrates the gasket 23 and fluid flow channel 22.

Figure 15:
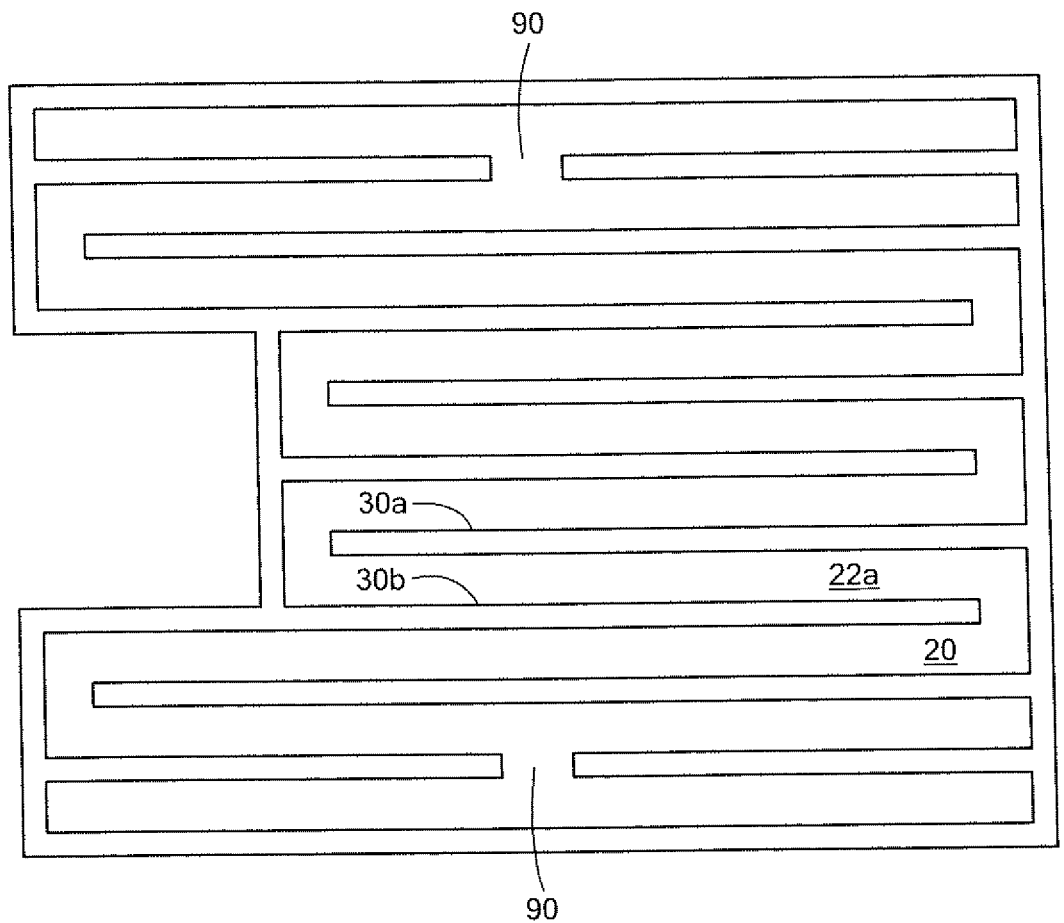
FIG. 15 is a view showing an array of channels within a hermetically sealed housing in accordance with the subject invention.
Figure 16:
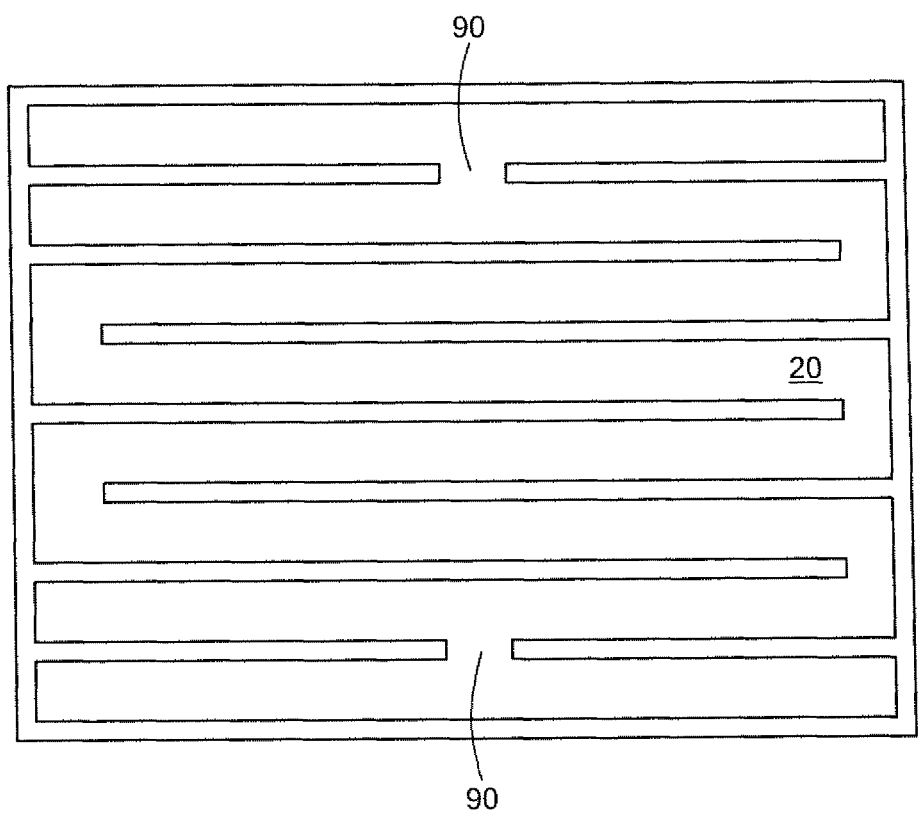
FIG. 16 is a schematic view showing another arrangement of the channels within a hermetically sealed housing in accordance with the subject invention.
Figure 17:
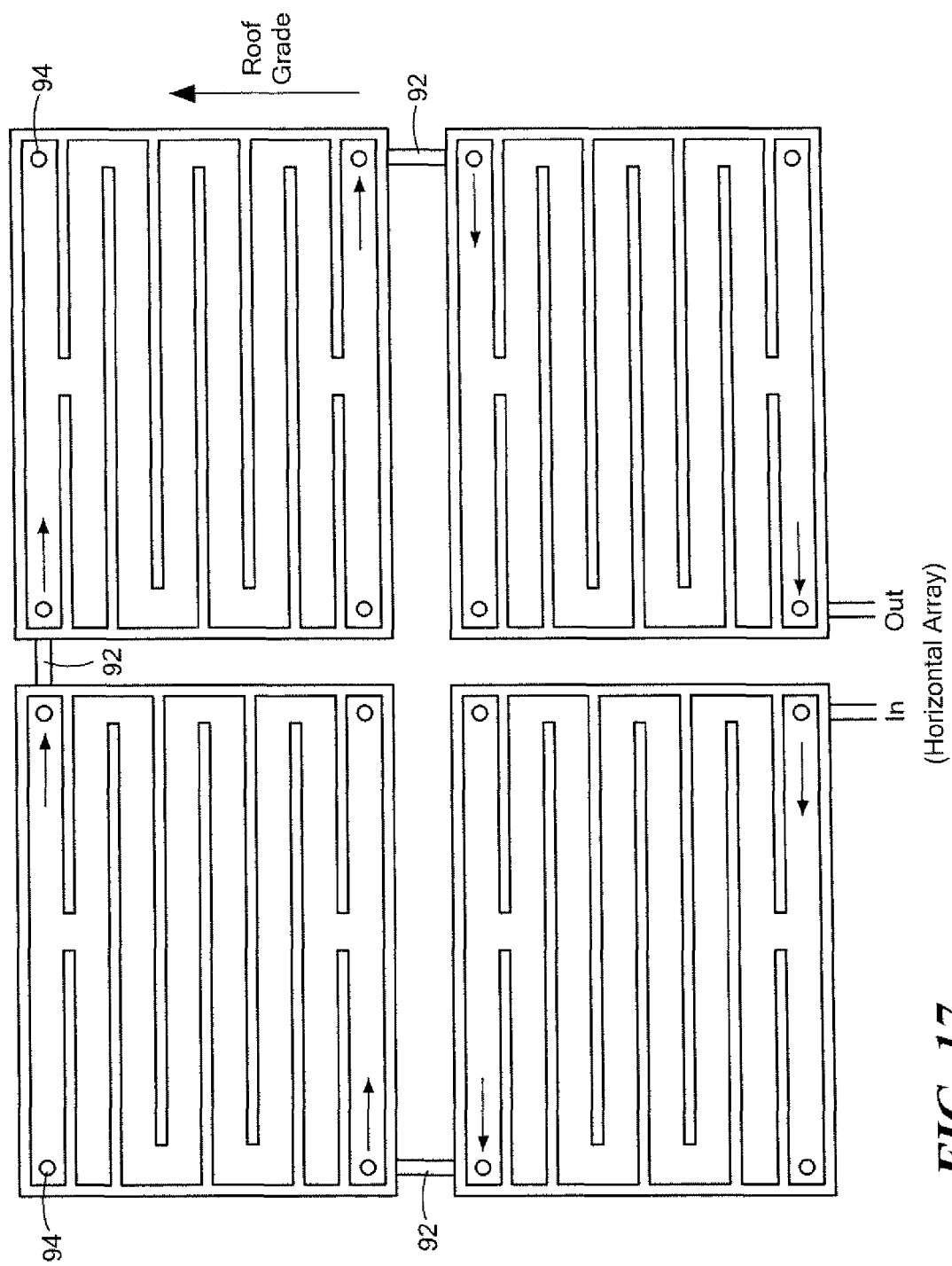
FIG. 17 is a schematic view showing examples of channels in a horizontal array in accordance with the subject invention.
Figure 18:
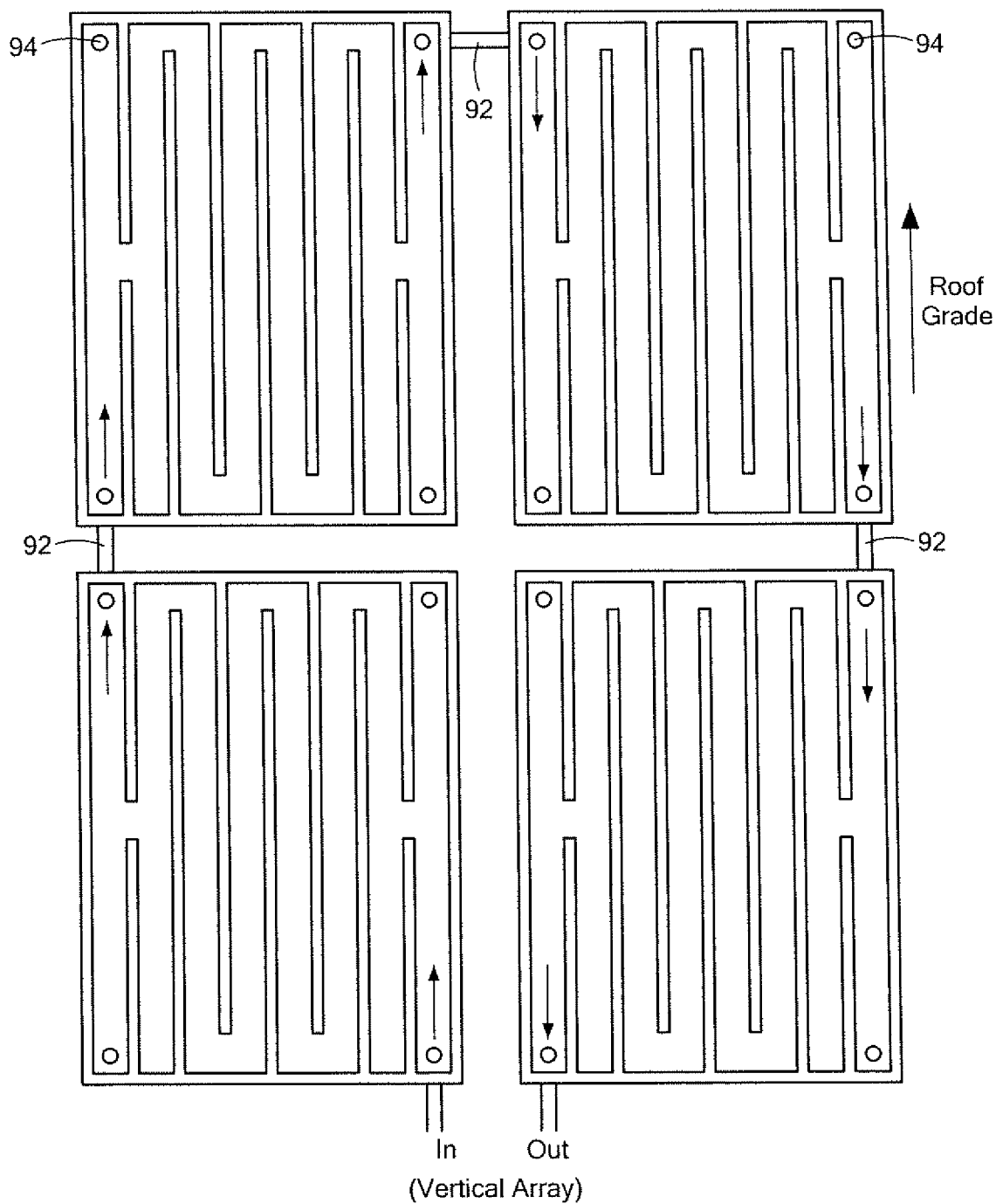
FIG. 18 is a schematic view showing an example of channels in a vertical array in accordance with the subject invention.

Another aspect of the invention is a unique flow pattern to allow high efficiency and easy installation/maintenance of the collector shown in, FIGS. 15 and 16. By splitting the inlet and outlet channel 90, versatility is provided to the collector without compromising efficiency. This allows external connections to be placed in all four corners of the SSEC. With the flow pattern and connections in all four corners it allows very short external connections 92 between collectors when installed in a grid pattern. This significantly reduces thermal losses and lowers cost. FIG. 17 shows a horizontal array configuration. Spare connections can be easily used for air/pressure relief valves or discharge valves 94. FIG. 18 shows a vertical array.

Figure 19:
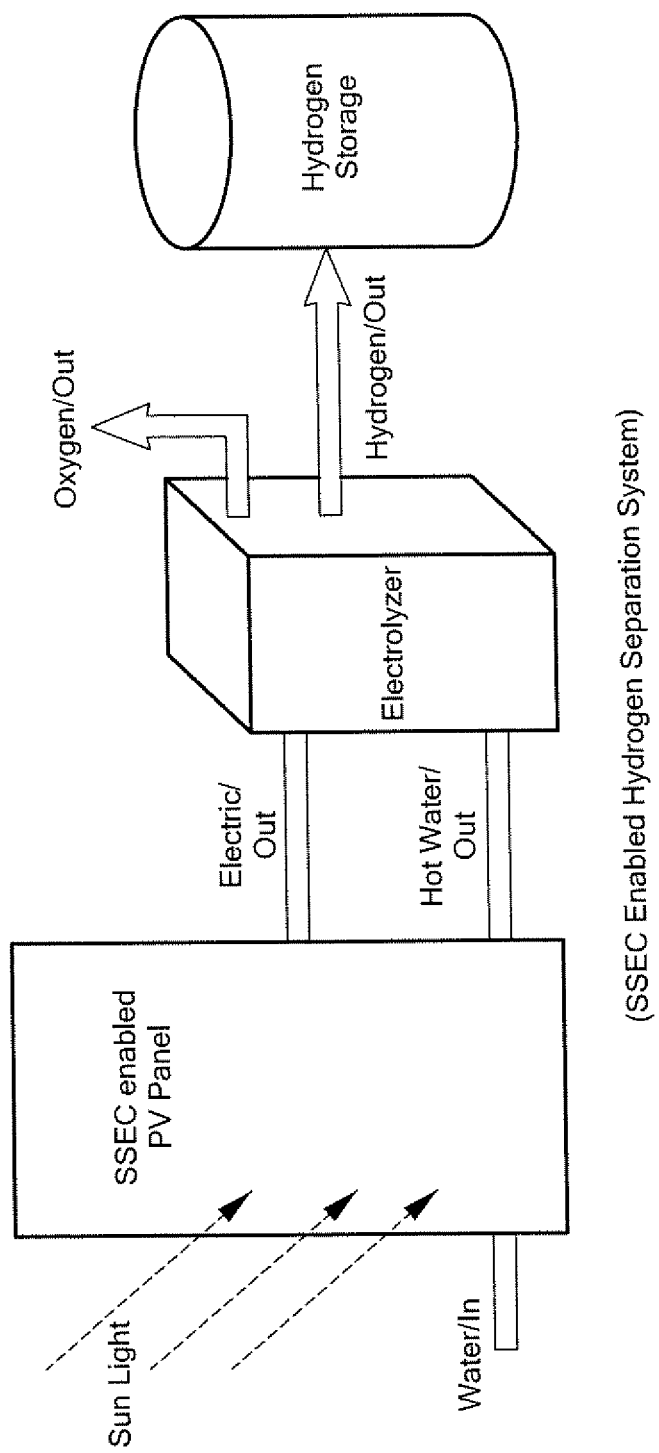
FIG. 19 is a block diagram showing the primary components associated with a supplemental solar energy collection system enabled hydrogen separation system in accordance with the subject invention.

FIG. 19 shows a simple block diagram of how SSEC enabled PV panel could source electrolyses for efficient hydrogen generation and storage.

One objective of the subject invention is to maximize energy efficiency per radiant area while minimizing cost. U.S. Pat. No. 4,392,008 relates to an early attempt to achieve this goal. The Supplemental Solar Energy Collector (SSEC) of the subject invention introduces new innovations that further improve energy efficiency per radiant area. There are many manufactures of PV (photovoltaic) panels working to achieve low $/Watt. The SSEC does not typically include the PV panel. Instead, it is designed to be attached with commercially available PV arrays. Attachment can be part of the manufacturing process, during final installation, or added after initial installation. Rather than using piping, the SSEC includes an integrated housing. This housing maximizes surface area for thermal transport from the PV panel and thermal conductance to the transporting fluid. The housing top surface 14, FIG. 8 doubles as the thermal collector or plate. The SSEC also innovates a unique flow pattern through the housing allowing efficient thermal collection, reduction in thermal losses, and ease of installation/service. The result is a significant improvement in efficiency.

Table 1 shows experimental data taken using a SSEC prototype. Electrical energy is improved by approximately 0.4% per degree C. of cooling. Useful thermal energy is collected by an increase of 195% in addition to PV alone when attaching the SSEC to the system. This increase energy without any change to collector area, thermal energy can be used for space heating, hot water, or improved efficiency of hydrogen separation.

TABLE 1

| Approx Irradiance Watts/m^2 | PV Electrical Energy (Watts) | SSEC thermal Energy (Watts)* | Efficiency Improvement |
|---|---|---|---|
| 500 | 120 | 234 | 195% |
| 900 | 210 | 410 | 195% |

1 Watt = 3.14 BTU's

The preferred Supplemental Solar Energy collector comprises an integrated hermetically sealed housing/container made from a low cost, high thermal conductive material to mate with PV panels and extract thermal energy. An innovative flow pattern within the housing maximizes installation and service versatility, variable inlets/outlets to maximize installation versatility, insulation is provided to minimize thermal loss and to maximize energy collection and fasteners are used to ease installation with a variety of PV panels.

Designing the supplemental collector to be one integrated piece improves efficiencies. The housing surface mating with the PV panel is preferably planar and acts as a thermal collector and exchanger to the fluid circulating within. It is designed to maximize the surface area in contact with both the PV panel and circulating fluid. This maximizes the conversion of thermal energy and allows less expensive material to be used with only a small efficiency loss. Aluminum alloy is a choice of material though others can be used. For the Prototype, A5052 was chosen though production versions may use A357 to improve thermal performance. A thin layer of thermal grease can be applied between the PV panel and SSEC to improve thermal conductivity. Anticorrosive additives may be added to the fluid and an anticorrosive coating may be applied or plated on the housing.

The unique flow pattern maximizes energy collection while allowing versatile installation. Most thermal collectors restrict collector grid and inlet/outlet patterns and have a significant compromise in energy efficiency of increase in cost. The flow patterns described herein eliminate this concern and ease installation. In addition, the variable inlet/outlet patterns allow for easy implementation of air relief or discharge mechanisms. They also minimize the amount of connector tubing needed to connect multiple collectors together. This is also an improvement in array efficiency. Industrial hose or PVC are suggested as the means to inter-connect collectors, though many other connection techniques are available.

The insulation is designed to encapsulate the SSEC and match the PV panel design to appear as one unit. The purpose is to minimize heat losses across the large surface area of the collectors without impacting ease of installation. It is also designed to provide drainage away from PV electrical connections in the event of a leak and a measure of physical insulation from the PV junction box from any conductive components of the SSEC. Typical insulations are Polyisocyanurate or Polyurethane foam board. Polyisocyanurate insulation was used in the prototype.

The fasteners are designed for simple attachment of the SSEC to PV panels and roof mountings. Today there is not a standard size for PV panels so a variety of fastener sizes and housings are available.

In summary, the SSEC is designed to maximize the total energy efficiency of converting solar energy for useful means. Electricity can be used locally or connected to the grid. Thermal energy can be used for a variety of heating purposes today provided by electricity or fossil fuels. Also by combining both products one can improve electrolyzer efficiency in hydrogen separation.

Figure 20:
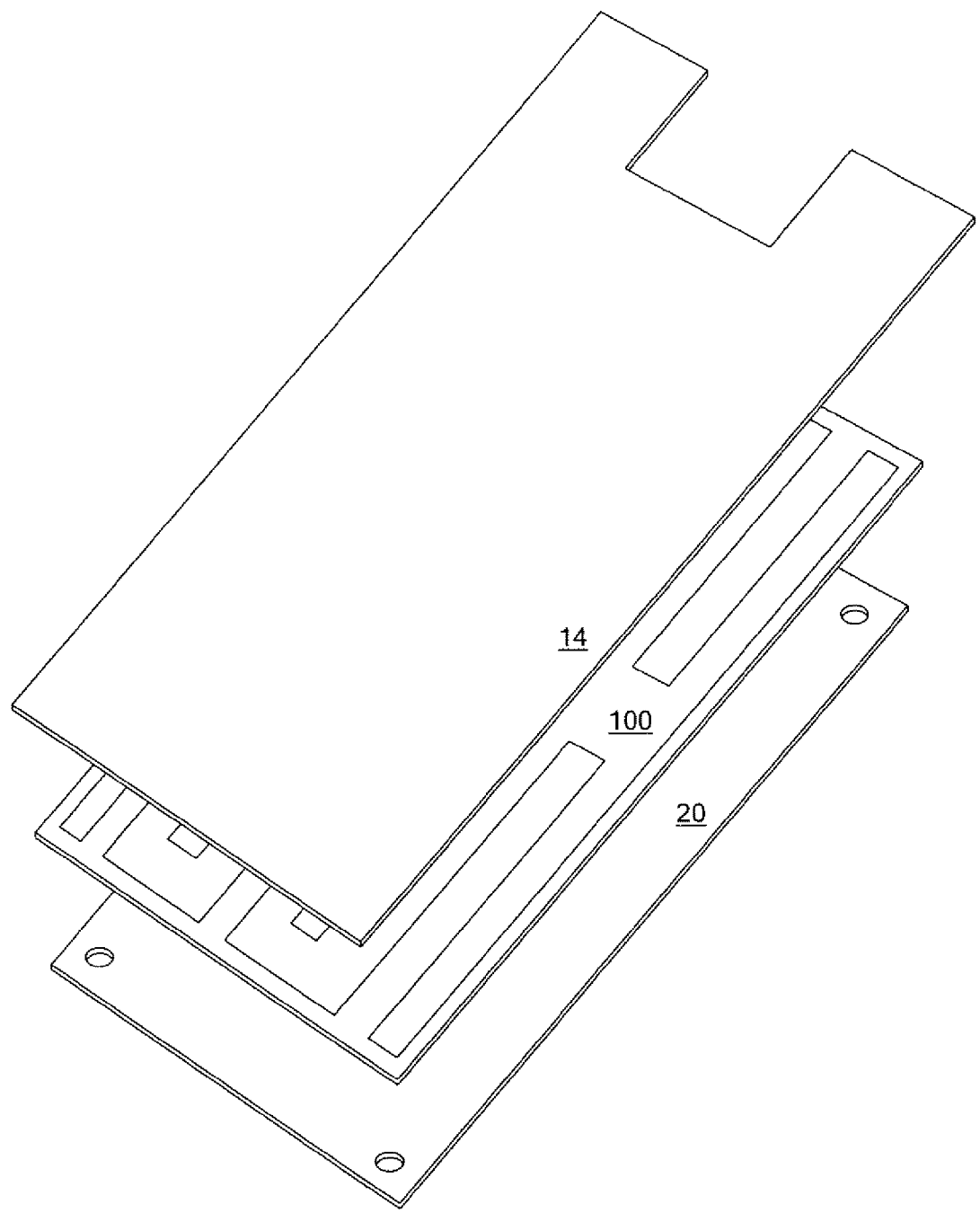
FIG. 20 is a schematic exploded view of a housing in accordance with the subject invention wherein a gasket defines the flow channels.

One embodiment of the invention is for the housing to serve multiple purposes. It is designed to maximize surface area to absorb heat and transmit it to the transfer liquid. Mating surface 14 to the PV panel is shown in FIG. 7. A thermal grease can be applied to surface 14 to improve thermal conductivity. A bottom view of the housing is shown in FIG. 6 includes a interior view of wall's/fins 30a that create flow conduits 22 to efficiently transfer thermal energy. Multipurpose inlets/outlets 50 and 52 are designed for standard pipe thread connections. These allow easy connection to other collectors, pump, or storage. Care in connector selection is recommended so not to react with aluminum. A nylon connector is suggested though there are alternatives. The housing is hermetically sealed though each conduit is not fully isolated from each other allowing air to easily escape when filled or drained. FIG. 20 shows a possible design with lip 20, FIG. 7 extrudes from the housing either on the bottom or top to allow easy fastening without impacting the hermetic seal. Depending upon the PV panel design, fasteners are created to attach the SSEC to the PV panel. FIG. 8 shows where bolt holes 21 are designed into the lip for attachment. However depending upon the PV panel frame design, the lip or holes may or may not be necessary. The lip can also be designed into the top of the housing attachment during PV panel manufacture.

Another feature of the subject invention is a unique flow pattern to allow high efficiency and easy installation/maintenance of the collector, FIGS. 15-16. By splitting the inlet and outlet conduit as shown at 90, versatility is provided to the collector without compromising efficiency. This allows external connections to be placed in all four corners of the SSEC. With the flow pattern and connections in all four corners it allows very short external connections 92, FIG. 17 between collectors when installed in a grid pattern. This significantly reduces thermal losses and lowers cost. FIG. 11 shows a horizontal array configuration. Spare connections can be easily used for air/pressure relief valves or discharge valves 94. FIG. 18 shows a vertical array.

Insulation is designed to complete the mating with individual PV panels. Its purpose is to minimize thermal losses, provide electrical insulation from electrical components of the PV panel, and provide drainage channels away from PV electrical components. These channels provide protection from condensation and any potential leaks.

FIG. 19 shows how a SSEC enabled PV panel could source an electrolyzer for efficient hydrogen generation and storage.

In addition the collector housing design should preferably include considerations for structural integrity during pressurization. One innovative technique to manage this is to sandwich a gasket material, such as a tape adhesive (e.g., 3M VHB tape), between two aluminum sheets and design the connections to manage whatever pressure the system is being designed for. These total pressures can be considerable. Consider a 20 inch by 50 inch housing. At 10 psi, the planar surface must maintain structural integrity at 10,000 pounds of force.

By designing the gasket material to maintain symmetric mechanical attachment points across the housing, these pressures can be withstood. The gasket material can also be designed into various flow patterns. For example, patterns shown in FIGS. 22, 23, and 24 can be employed.

Figure 21:
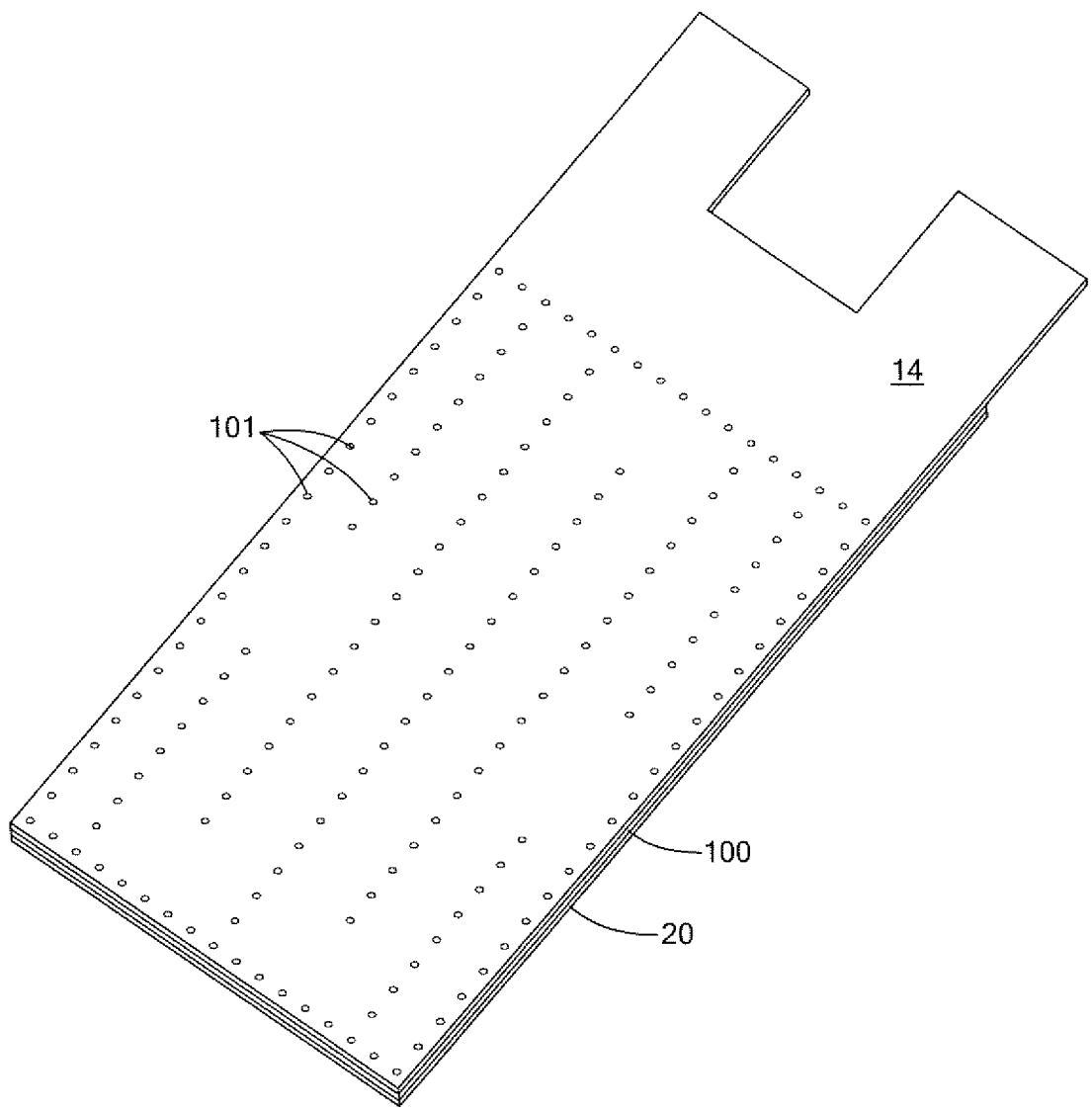
FIG. 21 is a schematic top view showing the housing of FIG. 21 assembled.

The gasket design shown in FIGS. 20-21 is easy to manufacture but care must be taken to match the maximum pressurization to the material construction. FIG. 20 shows two aluminum sheets 14 and 20 sandwiching gasket 100. The top sheet of aluminum 14 is planar and designed to mate with a commercial solar PV panel. The top is also designed to maximize the cooling of the PV panel to improve electrical efficiency. Gasket 100 is designed with a fluid flow pattern. The pattern can include those shown in FIG. 22, 23, or 24. Gasket thickness and channel width are designed to manage the desired fluid flow rate. The aluminum bottom 20 has inlets/outlets for fluid flow. The two sheets sandwich the gasket and can be connected with screws, rivets, or adhesive. The connectors 101 shown in FIG. 21 can be used to form a reliable hermetic seal with non-adhesive gaskets or weak adhesives that cannot withstand the design pressures. As seen FIG. 21, the connectors are preferably uniformly dispersed across the housing to maintain structural integrity under pressurization. For an example of the force exerted against the bottom and top plates, assume a 20 psi design pressure. If the housing dimensions are 20"×50" there is 20,000 lb. of force against the two plates. Thus, adhesive and/or connector strength must be factored into housing design.

Figure 22:
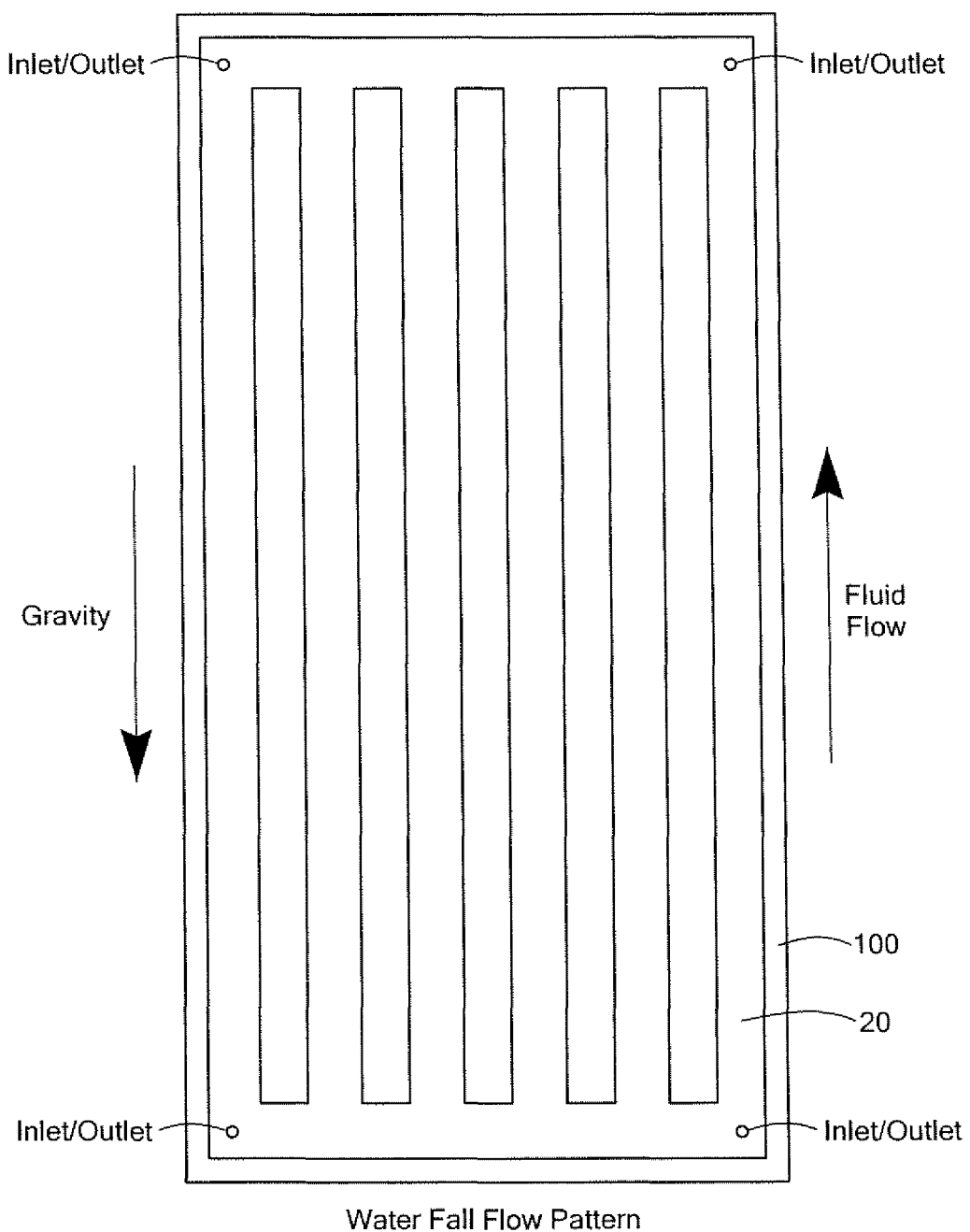
FIG. 22 is a schematic top view showing a gasket defining channels in a water fall flow pattern configuration.
Figure 23:
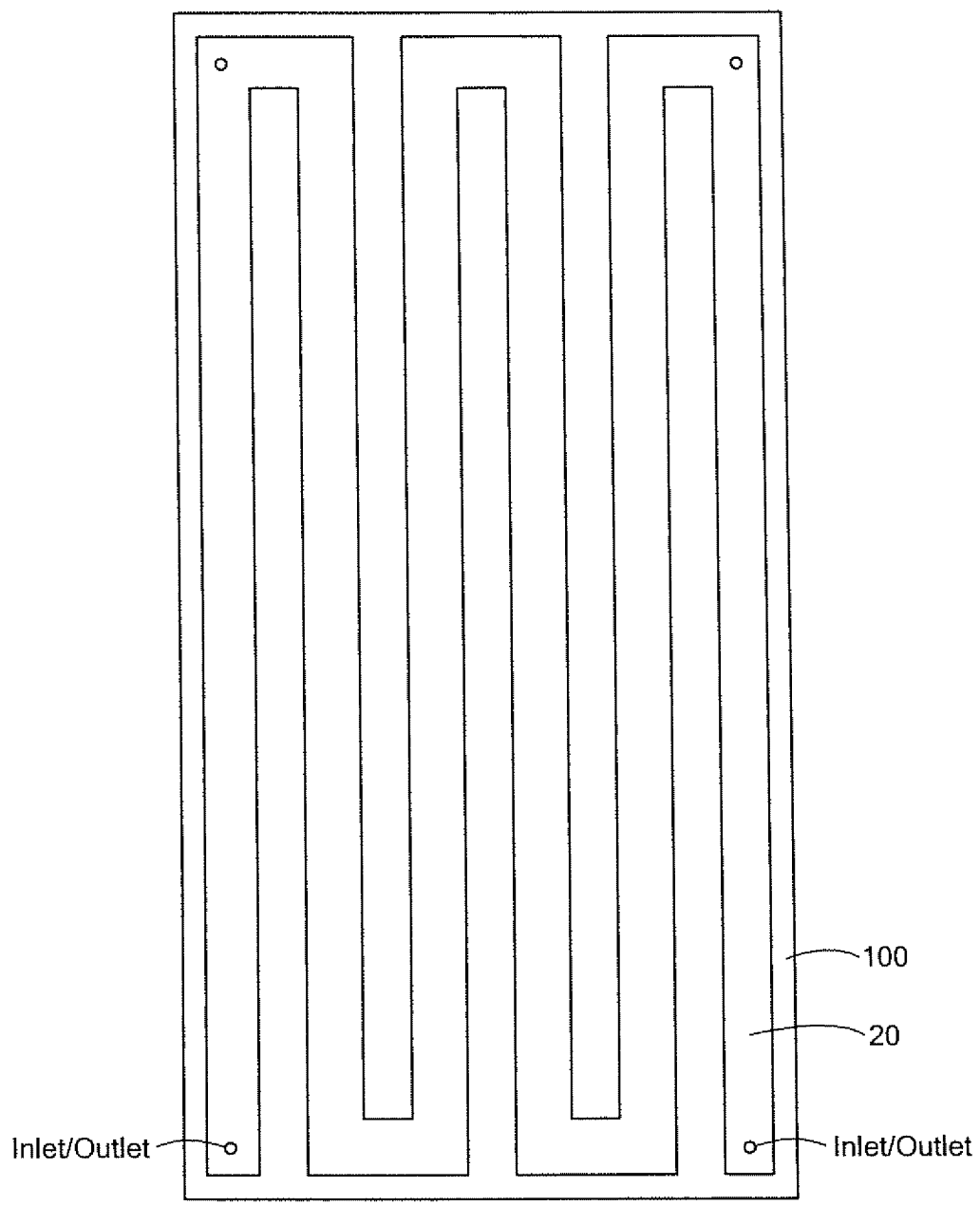
FIG. 23 is a schematic top view showing a gasket defining channels in a snake flow pattern.

Multiple flow patterns can be designed into the housing. The innovative pattern disclosed in FIG. 24 allows high efficiency and versatile installation. Small gaps 102 (e.g. ¼") at desired locations between the dividers 104 and periphery members 106 and the larger gaps (e.g., 4") 108 at other locations as shown are designed to allow easier filling or draining of the panel. In use, however fluid is still forced to flow in the channels defined by the dividers 100', 104, 106, and the like defining the flow channels may be made of double sided tape, and adhesive, and/or epoxy. Two other common patterns are waterfall and snake patterns. The waterfall pattern shown in FIG. 22 is the preferred pattern for drain back systems. There are typically no channels where water can be trapped to void drainage during evacuation. Waterfall systems may require a sloped installation with clear gravitational drainage. For best efficiency, fluid flow should be against gravity. The highest thermal transfer efficiency comes from a snake pattern shown in FIG. 23. The pattern disclosed in FIG. 24 combines the strengths of both waterfall and snake patterns along with installation versatility. Patterns shown in FIG. 22, 23, or 24 can be created using multiple techniques, gasket, adhesive, or formed in the panel. Neoprene, 3M VHB adhesive, or panel moldings are all examples on how the channels can be created.

Figure 24:
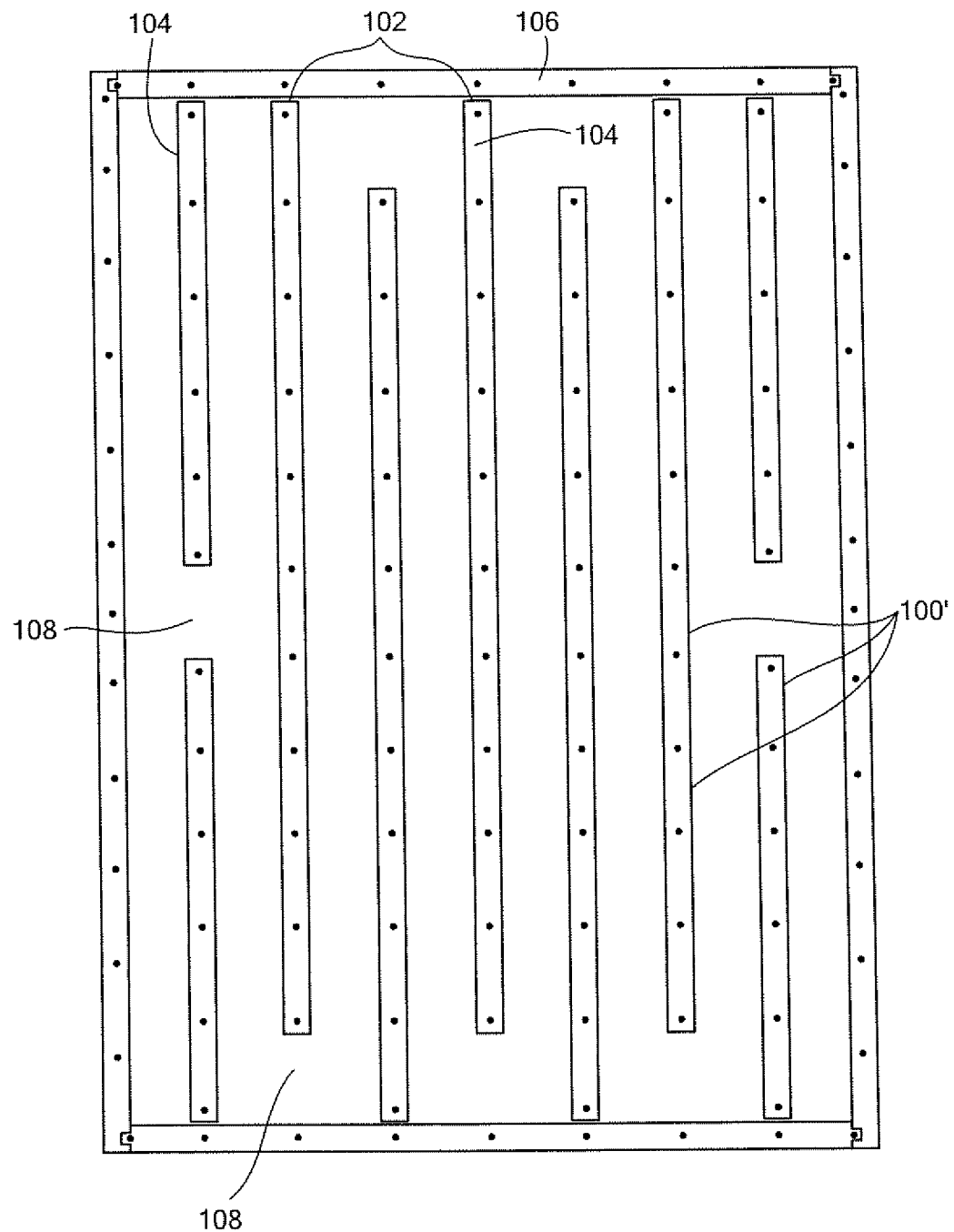
FIG. 24 is a view showing another arrangement of channels with a small gap to aid drain and fill cycles.

In another preferred example, double sided adhesive tape 100', FIG. 24 is adhered to bottom panel 20 in the pattern shown to produce the gasket between the top and bottom panels defining the fluid channels. The release layer on the top of the tape sections is then removed and the top panel is laid onto the taped sections. The housing is cured and riveted (see FIG. 21). Other gasket materials are possible including epoxies and/or adhesives.

Figure 25A:
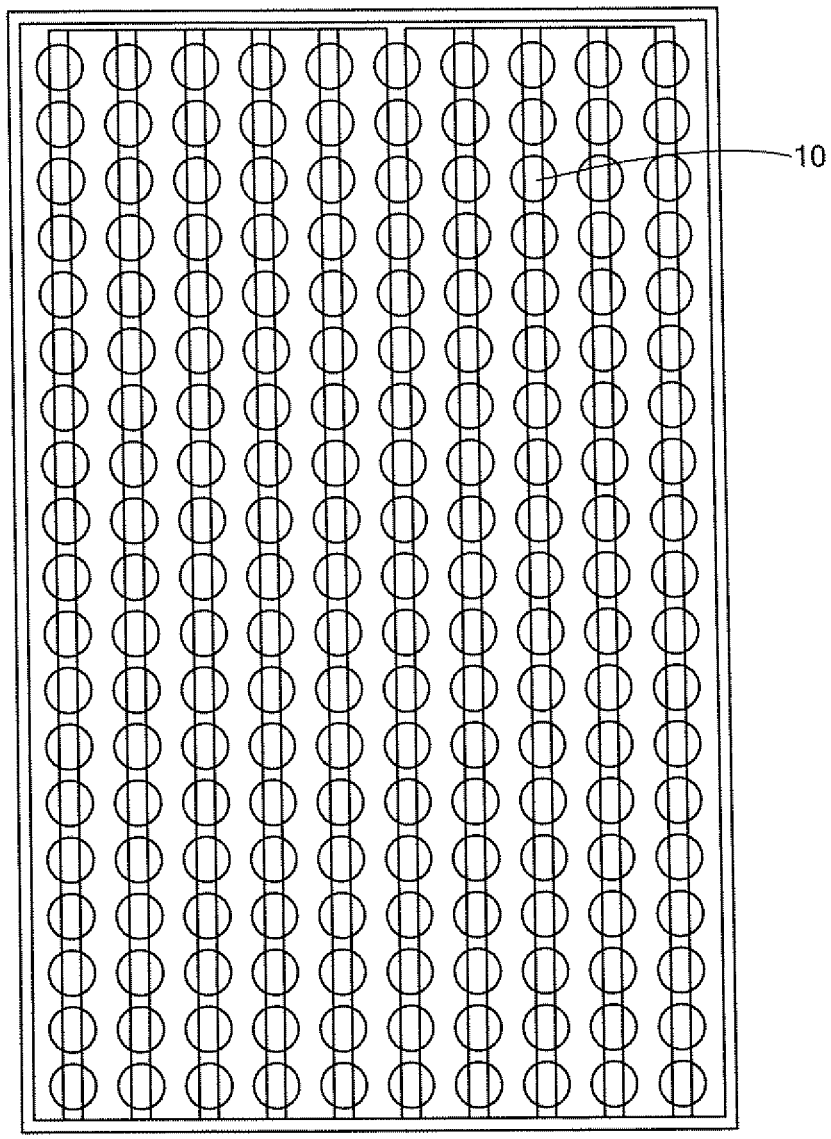
FIG. 25A is a top view of a fully integrated hybrid solar collector in accordance with the subject invention.
Figure 25B:
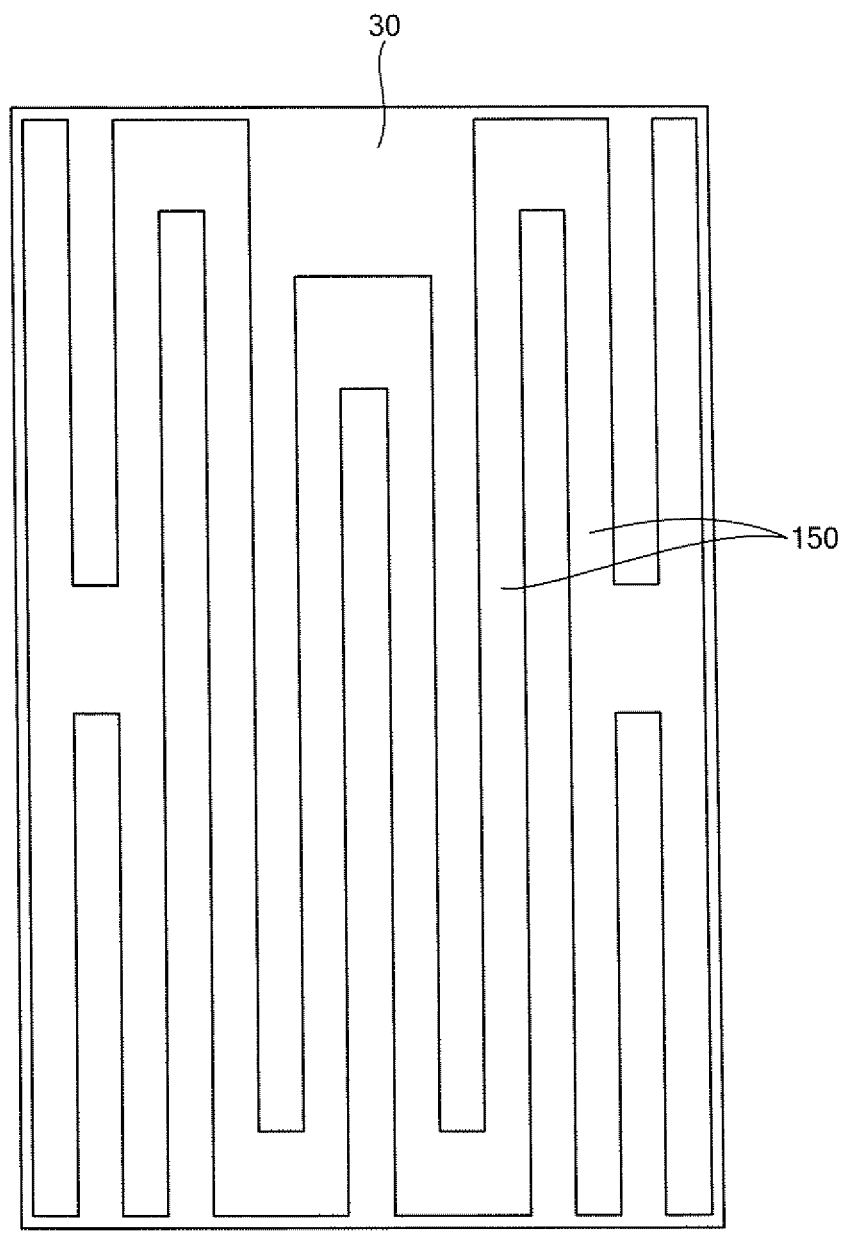
FIG. 25B is a bottom view of the solar panel of the collector shown in FIG. 25B.
Figure 26:
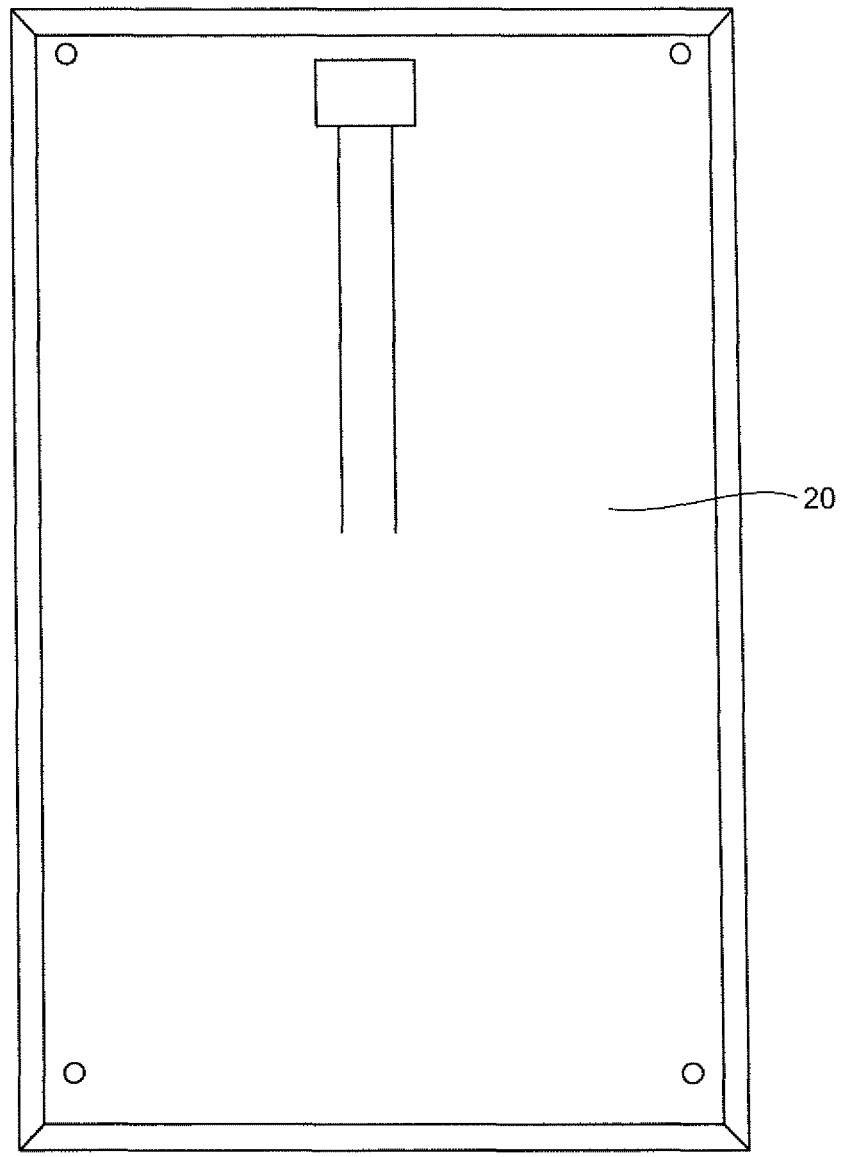
FIG. 26 is a view of the bottom panel of the collector shown in FIGS. 25A-25B.

In another embodiment, the housing with the fluid flow channels therein is integrated with the photovoltaic panel itself. The typical photovoltaic panel is usually a resin. By expanding its construction to mold fluid channels 150, FIG. 25B on the back, the top plate of the housing can be eliminated, FIG. 25. This back surface now becomes the top of the housing with fluid channels therein. Thus the housing is fully integrated with the photovoltaic panel construction as shown in FIG. 26. In another embodiment, the channels are molded into the bottom panel. In either case the two panels can then be hermetically sealed with adhesive.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A method of manufacturing an integrated supplemental solar energy collection system, the method comprising:
   assembling one panel of a housing;
   forming fluid channels in the panel with a viscoelastic foam tape; and
   assembling a photovoltaic panel onto the panel to convert incident radiation into electricity so heat is removed from the photovoltaic panel by fluid flowing in the fluid channels.

2. A supplemental solar energy collection system configured to be attached to any one of a plurality of commercially available photovoltaic panels, each photovoltaic panel for converting incident radiation into electricity and having a top for receiving the incident radiation and a rear surface opposing the top, the supplemental solar energy collection system comprising:
   a plurality of hermetically sealed housings configured in an array, each housing including:
      a top thermally conductive surface configured to be mated with the rear surface of one of the photovoltaic panels and serving as a thermal collector,
      a bottom surface,
      one or more compressible gaskets made of a viscoelastic foam tape extending between the top thermally conductive surface and the bottom surface and in contact with the respective top thermally conductive surface and bottom surface and configured to form open channels to carry fluid in contact with the top thermally conductive surface for removing heat from the photovoltaic panel; and
   an external connection in fluidic communication with said fluid located at each corner of each of said sealed housings configured such that at least one connection located at one corner functions as an inlet and at least another connection located in a different corner functions as an outlet such that the connection chosen as an outlet of one of said sealed housings is adjacent to the connection chosen as an inlet of another of said sealed housings for coupling the housings into a vertical array and/or horizontal array such that the connections chosen provide short external connectors between said housings in either of the vertical array or the horizontal array and wherein un-chosen connections of said vertical array and/or said horizontal array are plugged such that they are sealed or used as pressure release valves or discharge valves.

3. A plurality of supplemental solar energy collection systems, each system comprising a hermetically sealed housing formed from:
   a photovoltaic panel for converting incident radiation into electricity; and
   a housing including:
      a bottom made of a first material mated to the photovoltaic panel, and
      a compressible gasket made of a viscoelastic foam tape between the bottom and the photovoltaic panel defining channels between the photovoltaic panel and the bottom for fluid in contact with the photovoltaic panel for removing heat from the photovoltaic panel, and
      an external connection in fluidic communication with said fluid located at each corner of each of said sealed housing configured such that at least one connection located at one corner functions as an inlet and at least another connection located in a different corner functions as an outlet such that the connection chosen as an outlet of one of said sealed housings is adjacent to the connection chosen as an inlet of another of said sealed housings for coupling a plurality of sealed housings into a vertical array and/or horizontal array such that the connections chosen provide short external connectors between said housing in either of the vertical array or the horizontal array and wherein un-chosen connections of said vertical array and/or said horizontal array are plugged such that they are sealed or used as pressure release valves or discharge valves.

* * * * *